US012628702B2

(12) United States Patent
Lin et al.

(10) Patent No.: US 12,628,702 B2
(45) Date of Patent: May 12, 2026

(54) DISPLAY DEVICE

(71) Applicant: AUO Corporation, Hsinchu (TW)

(72) Inventors: Yu-Syuan Lin, Hsinchu (TW);
Chun-Liang Lin, Hsinchu (TW);
Peng-Yu Chen, Hsinchu (TW)

(73) Assignee: AUO Corporation, Hsinchu City (TW)

( * ) Notice: Subject to any disclaimer, the term of this
patent is extended or adjusted under 35
U.S.C. 154(b) by 388 days.

(21) Appl. No.: 18/527,394

(22) Filed: Dec. 4, 2023

(65) Prior Publication Data

US 2024/0371844 A1     Nov. 7, 2024

(30) Foreign Application Priority Data

May 3, 2023     (TW) ................................. 112116499

(51) Int. Cl.
*H10W 90/00*          (2026.01)
*H10H 20/85*          (2025.01)
(Continued)

(52) U.S. Cl.
CPC ........ *H10W 90/00* (2026.01); *H10H 20/8515*
(2025.01)

(58) Field of Classification Search
CPC ...... H10D 86/40; H10D 86/60; H10H 20/821;
H10H 29/142; H10H 20/851; H10H
20/8513; H10H 20/882; H10H 20/812;
H10H 29/24; H10H 29/962; H10H
29/851–8516; H10H 20/85–8516; H10H
29/37; H10H 29/012; H10H 29/32; H10H 29/34; H10H 29/345; H10H 20/8515;
H10H 20/855; H10H 20/8512; H10H
29/30; H10H 29/352; H10K 59/121;
H10K 59/00;
(Continued)

(56) References Cited

U.S. PATENT DOCUMENTS 10,606,121 B2     3/2020   Takeya et al.
10,775,667 B2     9/2020   Takeya et al.
(Continued)

FOREIGN PATENT DOCUMENTS

CN          109923673          6/2019
CN          110865477          3/2020
(Continued)

*Primary Examiner* — Sonya McCall-Shepard
(74) *Attorney, Agent, or Firm* — JCIPRNET

(57)          ABSTRACT
A display device includes a circuit substrate, first to third
light-emitting diodes, a bank structure, a color conversion
material layer, a first color filter component and a second
color filter component. The first to third light-emitting
diodes are located above the circuit substrate, wherein the
first and third light-emitting diodes are light-emitting diodes
of the same color, and the first and second light-emitting
diodes are light-emitting diodes of different colors. The bank
structure is located above the circuit substrate and has a first
opening and a second opening. The first opening is over-
lapping with the first light-emitting diode, and the second
opening is overlapping with the second and third light-
emitting diodes. The color conversion material layer is filled
into the first opening. The first color filter component is
overlapping with the color conversion material layer. The
second color filter component is overlapping with the second
opening.

10 Claims, 11 Drawing Sheets

(51) Int. Cl.
    *H10H 20/851*     (2025.01)
    *H10H 20/855*     (2025.01)
(58) Field of Classification Search
    CPC .. H10K 59/40–70; H10K 59/32; H10K 59/30;
                H10K 59/35–353; H10K 59/84; H10K
                59/86; H10K 2102/3023–3035; H10W
                                        90/00
    See application file for complete search history.

(56)                   References Cited

U.S. PATENT DOCUMENTS

| | | | |
|---|---|---|---|
| 11,107,949 B2 | 8/2021 | Wei et al. | |
| 11,776,990 B2 | 10/2023 | Sun et al. | |
| 11,796,857 B2 | 10/2023 | Takeya et al. | |
| 2022/0115470 A1 * | 4/2022 | Kim | H10D 86/40 |
| 2022/0130810 A1 * | 4/2022 | Park | H01L 25/0753 |
| 2022/0336526 A1 | 10/2022 | Sun et al. | |
| 2023/0163254 A1 | 5/2023 | Liang et al. | |

FOREIGN PATENT DOCUMENTS

| | | |
|---|---|---|
| CN | 110875345 | 3/2020 |
| TW | I767124 | 6/2022 |
| TW | I771171 | 7/2022 |
| TW | I797846 | 4/2023 |
| WO | 2019236325 | 12/2019 |

* cited by examiner

DISPLAY DEVICE

CROSS-REFERENCE TO RELATED APPLICATION

This application claims the priority benefit of Taiwan application no. 112116499, filed on May 3, 2023. The entirety of the above-mentioned patent application is hereby incorporated by reference herein and made a part of this specification.

BACKGROUND

Technical Field

The present invention relates to a display device.

Description of Related Art

With the advancement of technology, the resolution of display panels is getting higher and higher. In order to increase the resolution of the display panel, the size of various components in the display panel must inevitably be reduced, which greatly increases the difficulty of the process. For example, in light-emitting diode display devices, color conversion materials are usually used to convert the color of the light emitted by the light-emitting diodes. In current technology, inkjet methods can be used to form the color conversion materials. However, when manufacturing high-resolution display panels, because the size of the pixels is very small, it is necessary to place the color conversion material in a very small area, which leads to insufficient yield of the inkjet process.

SUMMARY

The present invention provides a display device that can improve the manufacturing yield of color conversion material layer.

At least one embodiment of the present invention provides a display device, which includes a circuit board, a first light-emitting diode, a second light-emitting diode, a third light-emitting diode, a bank structure, a color conversion material layer, a first color filter component and the second color filter component. The first to third light-emitting diodes are located above the circuit board, wherein the first and third light-emitting diodes are light-emitting diodes of the same color, and the first and second light-emitting diodes are light-emitting diodes of different colors. The bank structure is located above the circuit board and has a first opening and a second opening. The first opening is overlapping with the first light-emitting diode, and the second opening is overlapping with the second light-emitting diode and the third light-emitting diode. The first light-emitting diode, the second light-emitting diode and the third light-emitting diode are respectively configured to cause the display device to generate a first light-emitting region, a second light-emitting region and a third light-emitting region. The second light-emitting region is overlapping with the third light-emitting region. The color conversion material layer is filled in the first opening. The first color filter component is overlapping with the color conversion material layer. The second color filter component is overlapping with the second opening.

DESCRIPTION OF THE EMBODIMENTS

Figure 1A:
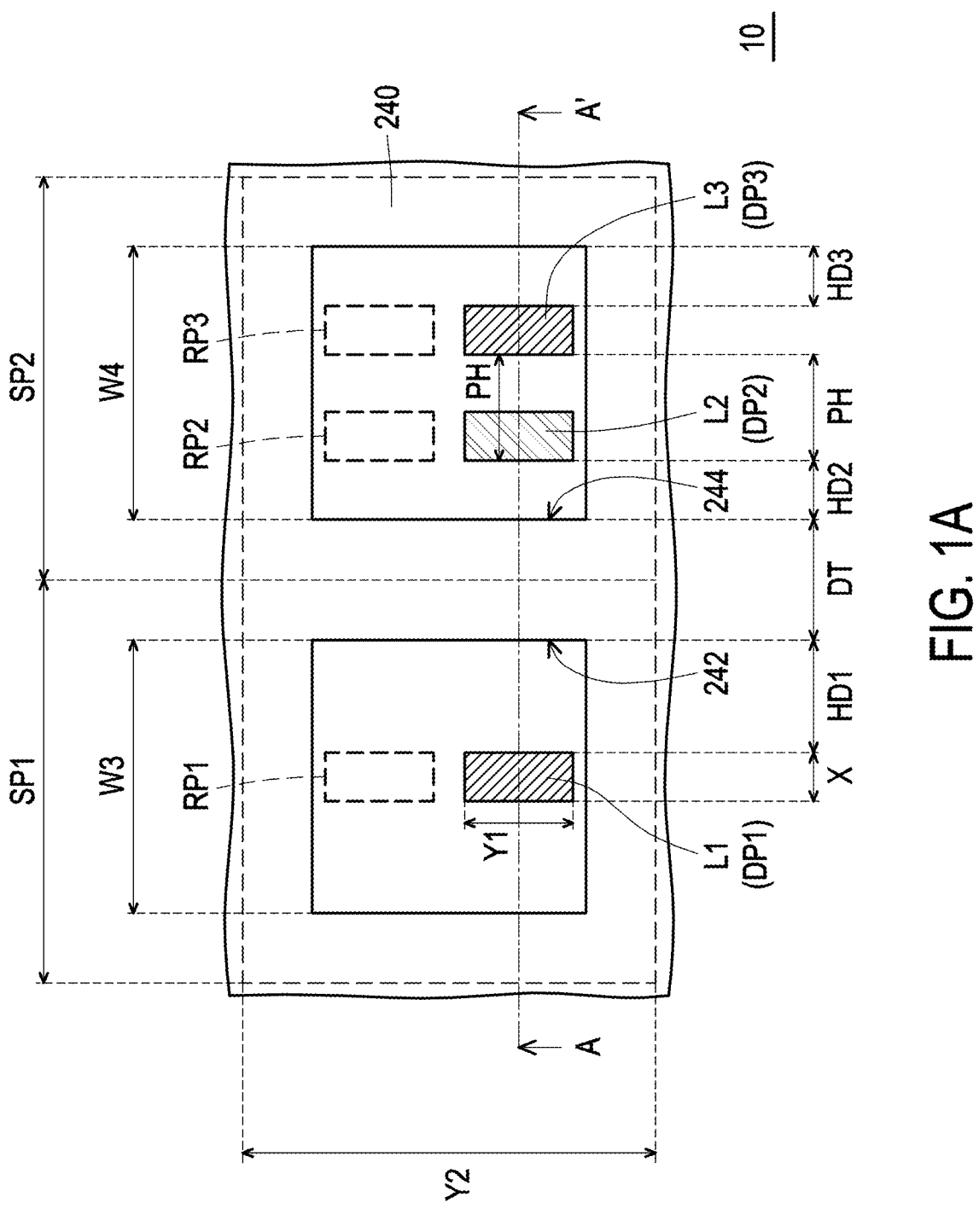
FIG. 1A is a partial top view of a display device according to an embodiment of the present invention.
Figure 1B:
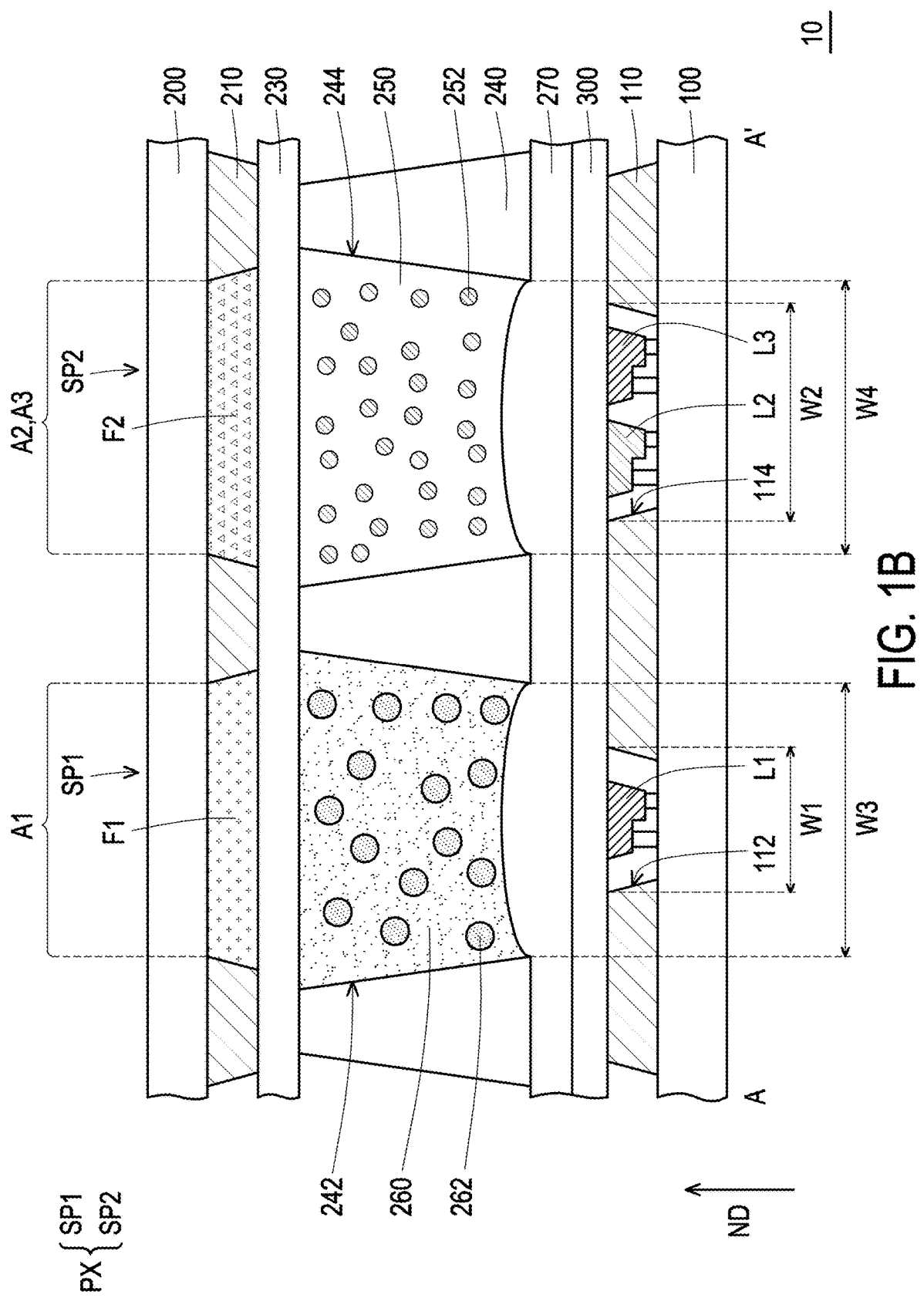
FIG. 1B is a schematic cross-sectional view of a display device according to an embodiment of the present invention.

FIG. 1A is a partial top view of a display device according to an embodiment of the present invention. FIG. 1B is a schematic cross-sectional view of a display device according to an embodiment of the present invention, wherein FIG. 1B corresponds to the position of line A-A' in FIG. 1A. It should be noted here that the display device 10 may include multiple pixels PX arranged in an array. For ease of explanation, FIG. 1A shows the first light-emitting diode L1, the second light-emitting diode L2, the third light-emitting diode L3, and the bank structure 240 corresponding to one of the pixels PX of the display device 10, and omits other components. In this embodiment, the first sub-pixel SP1 includes the first light-emitting diode L1, the second sub-pixel SP2 includes the second light-emitting diode L2 and the third light-emitting diode L3, and the first sub-pixel SP1 and the second sub-pixel SP2 constitute into a pixel PX. In some embodiments, the first sub-pixel SP1 and the second sub-pixel structure SP2 each have a width (or length) of 20 micrometers to 70 micrometers.

Referring to FIG. 1A and FIG. 1B. The display device 10 includes a circuit board 100, the first light-emitting diode L1, the second light-emitting diode L2, the third light-emitting diode L3, the bank structure 240, a color conversion material layer 260, a first color filter component F1 and a second color filter component F2. In this embodiment, the display device 10 further includes a light-shielding layer 110, an adhesive layer 300, a first protection layer 230, a scattering material layer 250, a second protection layer 270, a black matrix 210 and a substrate 200.

The circuit board 100 includes, for example, a carrier and multiple insulation layers and multiple conductive layers located on the carrier. The circuit board 100 includes, for example, a plurality of thin film transistors (not shown) or other electronic components.

The first light-emitting diode L1, the second light-emitting diode L2 and the third light-emitting diode L3 are located above the circuit board 100 and are electrically connected to the circuit board 100. The first light-emitting diode L1 and the third light-emitting diode L3 are light-emitting diodes of the same color, and the first light-emitting diode L1 and the second light-emitting diode L2 are light-emitting diodes of different colors. In some embodiments, the first light-emitting diode L1, the second light-emitting diode L2 and the third light-emitting diode L3 include two of the red light-emitting diode(s), the green light-emitting diode(s) and the blue light-emitting diode(s). The first light-emitting diode L1, the second light-emitting diode L2 and the third light-emitting diode L3 can be any form of light-emitting diode, such as a horizontal light-emitting diode or a vertical light-emitting diode. In some embodiments, the first light-emitting diode L1, the second light-emitting diode L2, and the third light-emitting diode L3 each have a length Y1 of 5 micrometers to 50 micrometers, and a width X of 5 micrometers to 15 micrometers. In some embodiments, the distance PH between the second light-emitting diode L2 and the third light-emitting diode L3 is 4 micrometers to 20 micrometers. In some embodiments, the distance PH between the second light-emitting diode L2 and the third light-emitting diode L3 is preferably greater than or equal to the width of a single light-emitting diode plus twice the process tolerance for transferring the light-emitting diodes (for example, 2 micrometers to 5 micrometers), thereby improving the yield of the transfer process of the second light-emitting diode L2 and the third light-emitting diode L3.

The light-shielding layer 110 is located above the circuit board 100. The light-shielding layer 110 includes a first hole 112 and a second hole 114. The first light-emitting diode L1 is located in the first hole 112 and is surrounded by the light-shielding layer 110, and the second light-emitting diode L2 and the third light-emitting diode L3 are located in the second hole 114 and are surrounded by the light-shielding layer 110. In this embodiment, the width W2 of the second hole 114 is greater than the width W1 of the first hole 112. Therefore, more light-emitting diodes can be disposed within the second hole 114. In other embodiments, the width W2 of the second hole 114 is equal to the width W1 of the first hole 112.

In some embodiments, an encapsulation layer (not shown) is disposed on the first light-emitting diode L1, the second light-emitting diode L2, the third light-emitting diode L3 and the light-shielding layer 110 to encapsulate the first light-emitting diode L1, the second light-emitting diode L2 and the third light-emitting diode L3 on the circuit board 100.

The substrate 200 is overlapping with the circuit board 100. The material of substrate 200 may include glass, quartz, organic polymer, or other applicable materials.

The first color filter component F1, the second color filter component F2 and the black matrix 210 are located between the substrate 200 and the circuit board 100. In some embodiments, the first color filter component F1, the second color filter component F2, and the black matrix 210 are formed on the substrate 200. The black matrix 210 is located between the first color filter component F1 and the second color filter component F2. The first color filter component F1 and the second color filter component F2 include filter components of different colors. In some embodiments, the first color filter component F1 may allow one of red, green, and blue light to pass through, and the second color filter component F2 may allow the other two of red, green, and blue light to pass through. The first color filter component F1 is overlapping with the first light-emitting diode L1 in the direction ND perpendicular to the surface of the substrate 200, and the second color filter component F2 is overlapping with the second light-emitting diode L2 and the third light-emitting diode L3 in the direction ND perpendicular to the surface of the substrate 200.

The first protection layer 230 is located on the first color filter component F1, the second color filter component F2 and the black matrix 210. In some embodiments, the material of the first protection layer 230 includes silicon oxide, silicon nitride, silicon oxynitride or other suitable materials.

The bank structure 240 is located above the circuit board 100. In this embodiment, the bank structure 240 is formed on the first protection layer 230 and is located between the substrate 200 and the circuit board 100. In some embodiments, the bank structure 240 includes an organic material (such as a photoresist) and a reflective material disposed on the surface of the organic material or inside the organic material, but the invention is not limited thereto. In other embodiments, the bank structure 240 includes, for example, silicon dioxide, optical adhesive, or other suitable materials. In this embodiment, the bank structure 240 has a structure that is narrower at the top and wider at the bottom, but the invention is not limited thereto. In other embodiments, the bank structure 240 has vertical sidewalls or the bank structure 240 has a structure that is narrower at the bottom and wider at the top. In some embodiments, the bank structure 240 has a thickness of 10 micrometers to 20 micrometers. The bank structure 240 has a first opening 242 and a second opening 244. The first opening 242 is overlapping with the first color filter component F1 and the first light-emitting diode L1 in the direction ND perpendicular to the surface of the substrate 200, and the second opening 244 is overlapping with the second color filter component F2, the second light-emitting diode L2 and the third light-emitting diode L3 in the direction ND perpendicular to the surface of the substrate 200.

In this embodiment, since the second light-emitting diode L2 and the third light-emitting diode L3 share one second opening 244, the number of openings of the bank structure 240 corresponding to a single pixel PX can be reduced. In other words, there is no need to make each light-emitting diode correspond to different openings. Therefore, the width W3 of the first opening 242 and the width W4 of the second opening 244 can be increased.

In some embodiments, the distance DT between the first opening 242 and the second opening 244 is 10 micrometers to 16 micrometers. In some embodiments, the width W3 of the first opening 242 and the width W4 of the second opening 244 are greater than 21 micrometers, for example, greater than 21 micrometers and less than 70 micrometers. In some embodiments, the width W3 of the first opening 242 is the width X of the light-emitting diode plus twice the process tolerance for transferring the light-emitting diodes, and the width W4 of the second opening 244 is twice the width X of the light-emitting diode plus four times the process tolerance for transferring the light-emitting diodes. In some embodiments, the width W3 of the first opening 242 and the width W4 of the second opening 244 are the same as or different from each other. In some embodiments, the first opening 242 and the second opening 244 each have a length Y2 of 64 micrometers to 100 micrometers. In some embodiments, the first opening 242 and the second opening 244 have the same or different lengths from each other.

The scattering material layer 250 and the color conversion material layer 260 are formed on the first protection layer 230, wherein the first protection layer 230 is located between the color conversion material layer 260 and the first color filter component F1 and between the scattering material layer 250 and the second color filter component F2.

The color conversion material layer 260 is filled in the first opening 242. The color conversion material layer 260 includes an organic material and color conversion materials 262 dispersed in the organic material. The color conversion materials 262 are, for example, at least one of quantum dot materials, phosphorescent materials, fluorescent materials, dyes, and perovskite materials. The color conversion material layer 260 is overlapping with the first color filter component F1 and the first light-emitting diode L1 in the direction ND perpendicular to the surface of the substrate 200.

The scattering material layer 250 is filled in the second opening 244. The scattering material layer 250 includes an organic material and scattering particles 252 dispersed in the organic material. The scattering particles 252 are, for example, porous (or air-containing) silicon oxide ($SiO_2$), titanium oxide ($TiO_2$), aluminum oxide ($Al_2O_3$), calcium carbonate ($CaCO_3$), barium sulfate ($BaSO_4$), zirconium oxide ($ZrO_2$), metal-coated polymer particles, hollow polymer particles or other reflective microstructures. The scattering material layer is overlapping with the second light-emitting diode and the third light-emitting diode. In some embodiments, the scattering material layer 250 includes an organic material with a refractive index of approximately 1.5 and scattering particles 252 with a refractive index of approximately 2.2 dispersed in the organic material. In some embodiments, the volume percent concentration of the scattering particles 252 in the scattering material layer 250 is approximately 0.5 v %. The scattering material layer 250 is overlapping with the second color filter component F2, the second light-emitting diode L2, and the third light-emitting diode L3 in the direction ND perpendicular to the surface of the substrate 200.

Figure 1C:
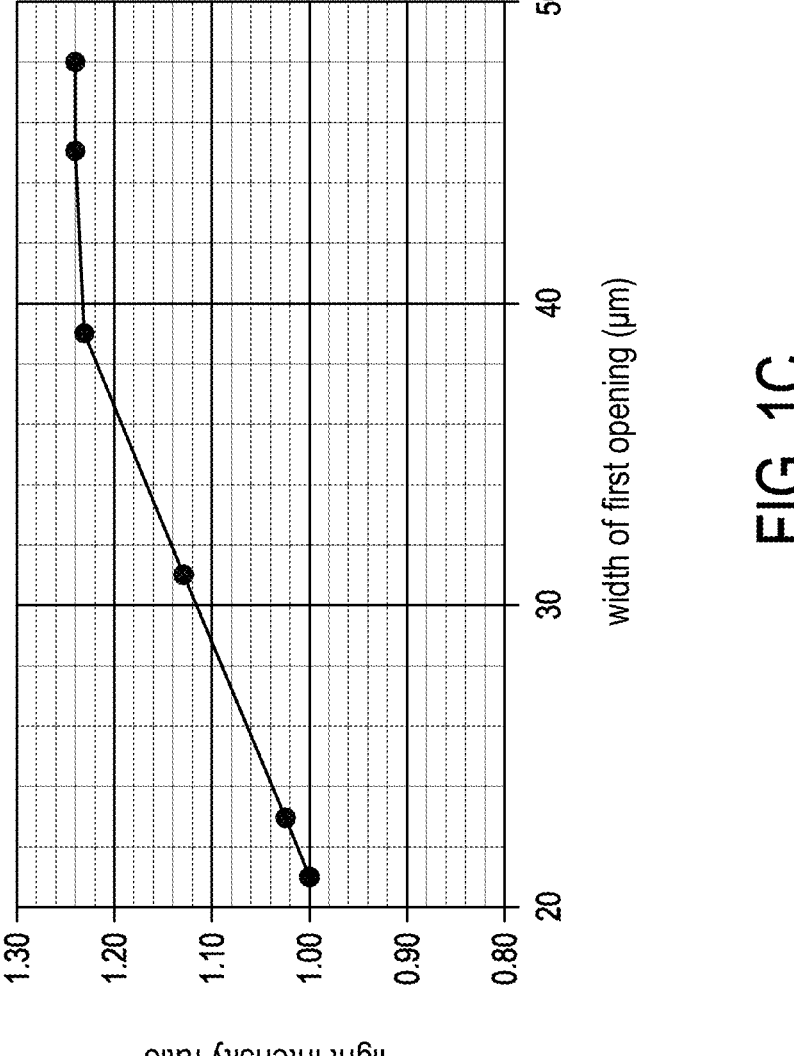
FIG. 1C is the relationship between the light intensity ratio of the first sub-pixel and the width of the first opening according to some embodiments of the present invention.

In some embodiments, the lateral distance HD1 between the first light-emitting diode L1 and the bank structure 240 is 2 micrometers to 44 micrometers, and the lateral distance HD2 between the second light-emitting diode L2 and the bank structure 240 is 2 micrometers to 22 micrometers, and the lateral distance HD3 between the third light-emitting diode L3 and the bank structure 240 is 2 micrometers to 22 micrometers. In this embodiment, by increasing the width W3 of the first opening 242 and the width W4 of the second opening 244, not only can the process difficulty of forming the color conversion material layer 260 and the scattering material layer 250 be reduced, but also the lateral distance between the light-emitting diodes and the bank structure 240 can be increased. Increasing the lateral distance between the light-emitting diodes and the bank structure 240 can reduce the proportion of light emitted by the light-emitting diode that is absorbed by the bank structure 240, thereby improving the luminous efficiency of the display device 10. FIG. 1C is the relationship between the light intensity ratio of the first sub-pixel SP1 and the width W3 of the first opening 242 according to some embodiments of the present invention. The length Y2 of the first opening 242 is maintained and the width W3 of the first opening 242 is changed. Taking the light intensity as 1 when the width W3 of the first opening 242 is 21 micrometers, the increase in light intensity can be calculated to obtain the result shown in FIG. 1C. It can be known from FIG. 1C that increasing the width W3 of the first opening 242 can increase the luminous efficiency of the first sub-pixel SP1. Furthermore, in FIG. 1C, an experiment is conducted with the first light-emitting diode L1 with a width X of 21 micrometers. From FIG. 1C, it can be seen that when the width W3 of the first opening 242 exceeds the width X of the first light-emitting diode L1 by about 20 micrometers (i.e., when the width W3 of the first opening 242 is about 41 micrometers), the light intensity of the first sub-pixel SP1 increases by about 23% compared to when the width W3 of the first opening 242 is 21 micrometers.

Figure 1D:
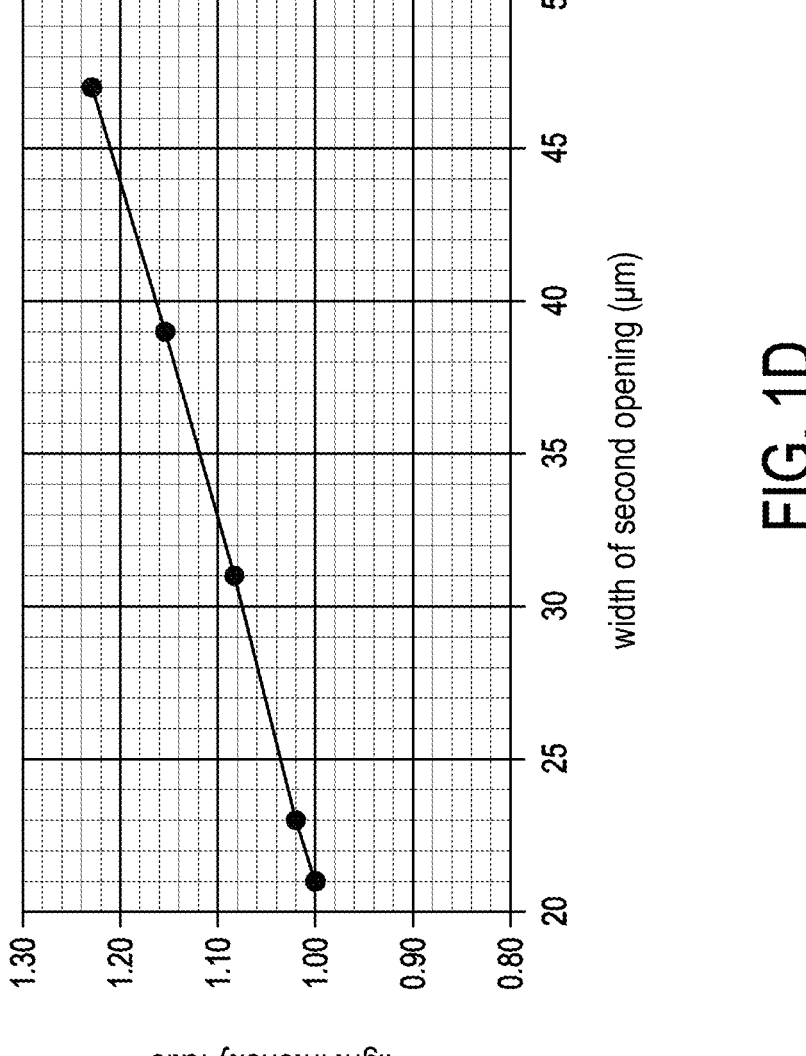
FIG. 1D is the relationship between the light intensity ratio of the second sub-pixel and the width of the second opening according to some embodiments of the present invention.

FIG. 1D is the relationship between the light intensity ratio of the second sub-pixel SP2 and the width W4 of the second opening 244 according to some embodiments of the present invention. The length Y2 of the second opening 244 is maintained and the width W4 of the second opening 244 is changed. Taking the light intensity as 1 when the width W4 of the second opening 244 is 21 micrometers, the increase in light intensity can be calculated to obtain the result shown in FIG. 1D. It can be known from FIG. 1D that increasing the width W4 of the second opening 244 can increase the luminous efficiency of the second sub-pixel SP2. Furthermore, in FIG. 1D, an experiment is conducted with the second light-emitting diode L2 with a width X of 21 micrometers. From FIG. 1D, it can be seen that when the width W4 of the second opening 244 increases from about 21 micrometers to about 40 micrometers, the light intensity of the second sub-pixel SP2 increases by about 16%.

Figure 3:
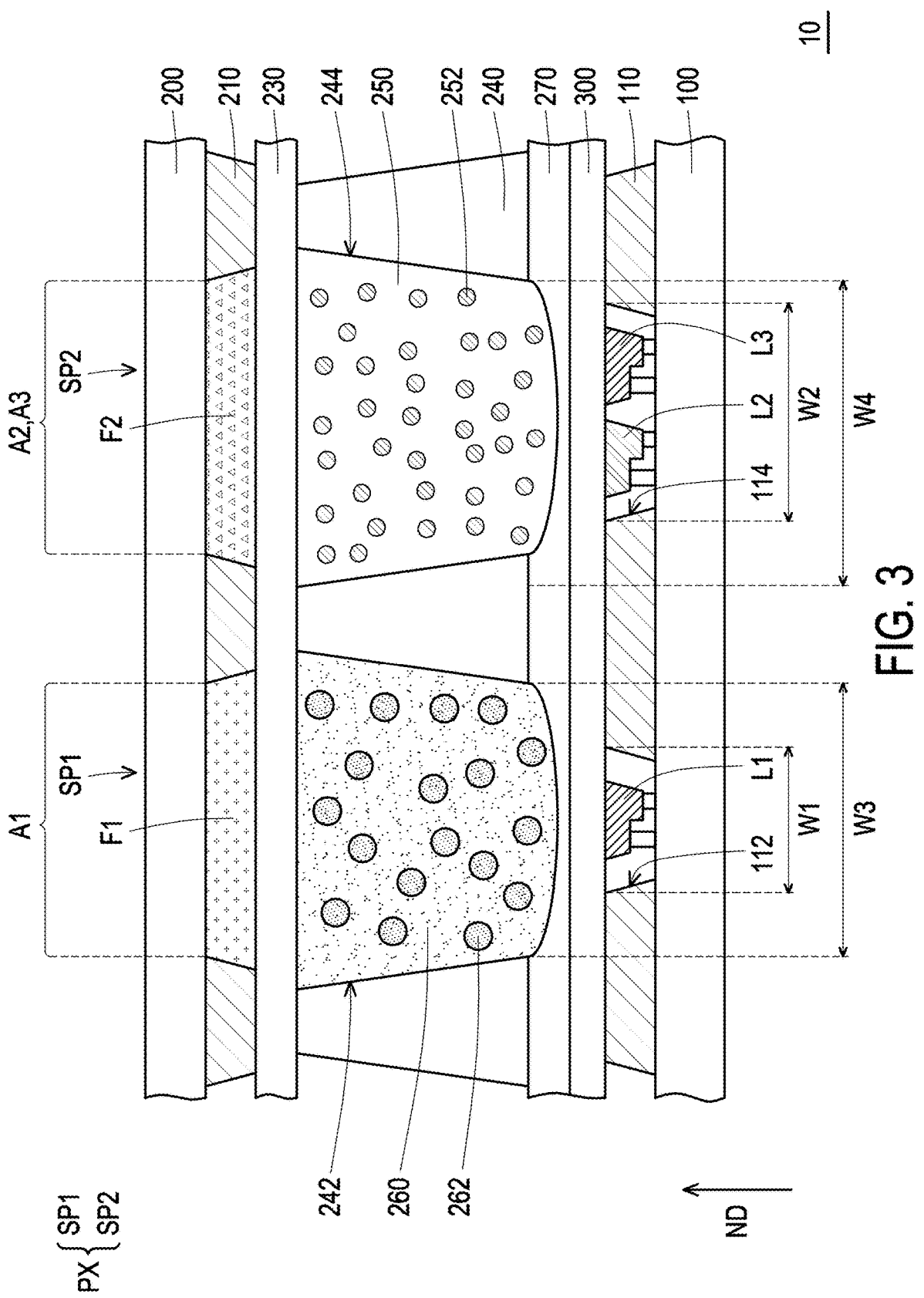
FIG. 3 is a schematic cross-sectional view of a display device according to an embodiment of the present invention.

Returning to FIGS. 1A and 1B, the second protection layer 270 is formed on the bank structure 240, the scattering material layer 250 and the color conversion material layer 260. The second protection layer 270 is located above the first light-emitting diode L1, the second light-emitting diode L2 and the third light-emitting diode L3. In this embodiment, the second protection layer 270 protrudes at the positions of the scattering material layer 250 and the color conversion material layer 260, but the invention is not limited thereto. In other embodiments, the second protection layer 270 is recessed at the positions of the scattering material layer 250 and the color conversion material layer 260 (as shown in FIG. 3).

The adhesive layer 300 is located on the first light-emitting diode L1, the second light-emitting diode L2, the third light-emitting diode L3 and the light-shielding layer 110. In some embodiments, the adhesive layer 300 is formed on an encapsulation layer (not shown) on the first light-emitting diode L1, the second light-emitting diode L2, and the third light-emitting diode L3. The adhesive layer 300 is located between the first light-emitting diode L1 and the second protection layer 270, between the second light-emitting diode L2 and the second protection layer 270, and between the third light-emitting diode L3 and the second protection layer 270.

In the display device 10, the first light-emitting diode L1, the second light-emitting diode L2, and the third light-emitting diode L3 are respectively configured to cause the display device 10 to generate the first light-emitting region A1, the second light-emitting region A2, and the third light-emitting region A3. Specifically, the light emitted by the first light-emitting diode L1 is converted by the color conversion material layer 260 and then passes through the first color filter component F1 to form the first light-emitting region A1; the light emitted by the second light-emitting diode L2 and the third light-emitting diode L3 continues to pass through the second color filter component F2 after passing through the scattering material layer 250, forming the second light-emitting area A2 and the third light-emitting area A3, wherein the second light-emitting region A2 is overlapping with the third light-emitting region A3. In this embodiment, the black matrix 210 defines the first light-emitting region A1, the second light-emitting region A2 and the third light-emitting region A3, and the second light-emitting region A2 and the third light-emitting region A3 are located at the same position.

In some embodiments, the first light-emitting diode L1 and the third light-emitting diode L3 comprise blue light-emitting diodes, the second light-emitting diode L2 comprises a green light-emitting diode. The color conversion material layer 260 includes a color conversion material 262 that emits red light after absorbing blue light. The first color filter component F1 includes a red color filter component, and the second color filter component F2 includes a blue-green (cyan) color filter component.

In some embodiments, the first light-emitting diode L1 and the third light-emitting diode L3 comprise blue light-emitting diodes, the second light-emitting diode L2 comprises a red light-emitting diode. The color conversion material layer 260 includes a color conversion material 262 that emits green light after absorbing blue light. The first color filter component F1 includes a green color filter component, and the second color filter component F2 includes a purple color filter component.

Referring to FIG. 1A. In this embodiment, the first sub-pixel SP1 includes a first placement region DP1 and a first repair region RP1, and the second sub-pixel SP2 includes a second placement region DP2, a second repair region RP2, a third placement region DP3 and a third repair region RP3. The first light-emitting diode L1 is disposed in the first placement region DP1 or the first repair region RP1, the second light-emitting diode L2 is disposed in the second placement region DP2 or the second repair region RP2, and the third light-emitting diode L3 is disposed in the third placement region DP3 or the third repair region RP3. For example, when the light-emitting diode in the placement region is fault or the light-emitting diode is not correctly transferred to the placement region, the light-emitting diode used for repair is transferred to the repair region through the repair process. When the light-emitting diodes used for repair are transferred to the repair region, the placement region may include a faulty light-emitting diode or no light-emitting diode at all.

FIGS. 2A to 2E are schematic cross-sectional views of a manufacturing method of a display device according to an embodiment of the present invention. It should be noted herein that, in embodiments provided in FIGS. 2A to 2E, element numerals and partial content of the embodiments provided in FIGS. 1A to 1D are followed, the same or similar reference numerals being used to represent the same or similar elements, and description of the same technical content being omitted. For a description of an omitted part, reference may be made to the foregoing embodiment, and the descriptions thereof are omitted herein.

Figure 2A:
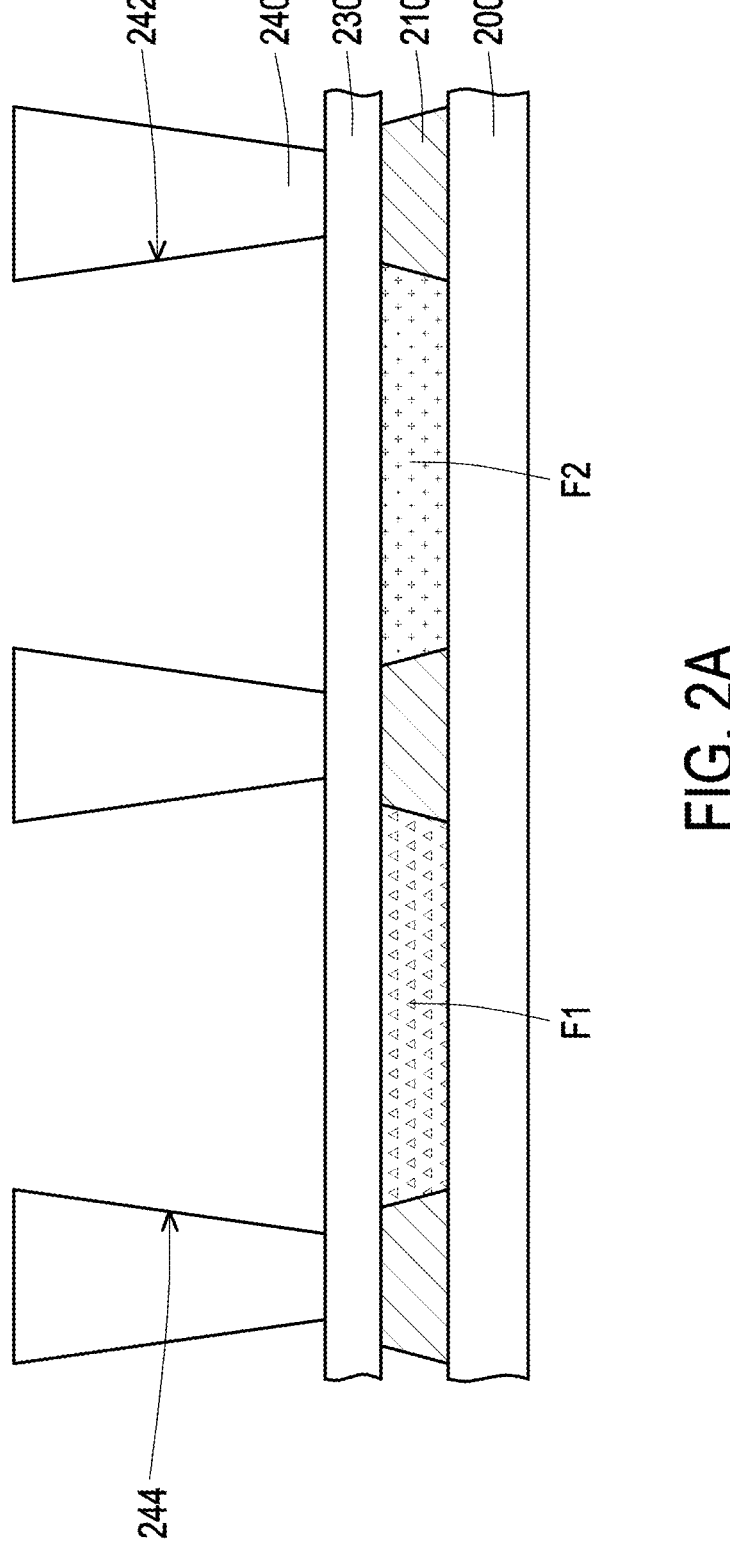
FIGS. 2A to 2E are schematic cross-sectional views of a manufacturing method of a display device according to an embodiment of the present invention.

Referring to FIG. 2A, the first color filter component F1, the second color filter component F2 and the black matrix 210 are formed above the substrate 200. The first protection layer 230 is formed on the first color filter component F1, the second color filter component F2 and the black matrix 210. The bank structure 240 is formed on the first protection layer 230.

Figure 2B:
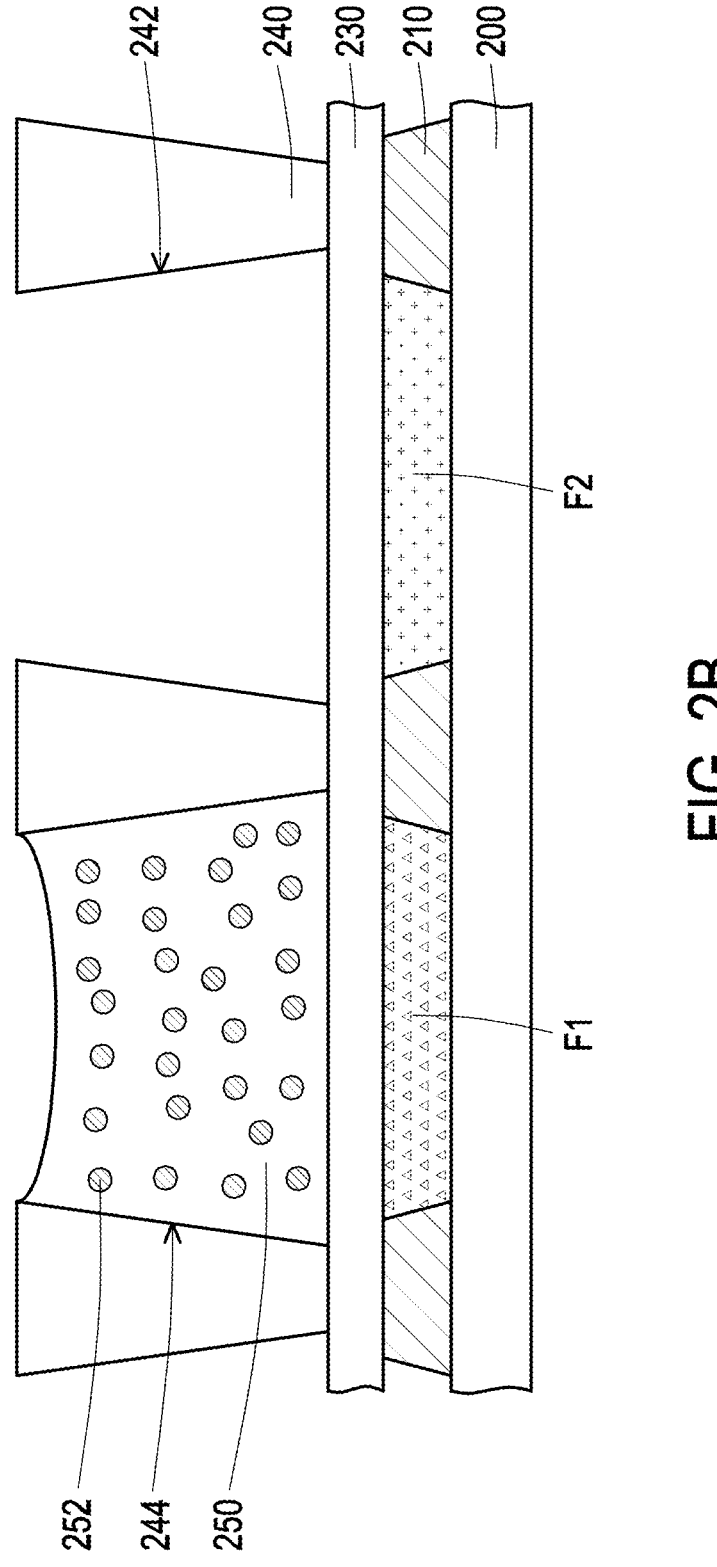
Figure 2C:
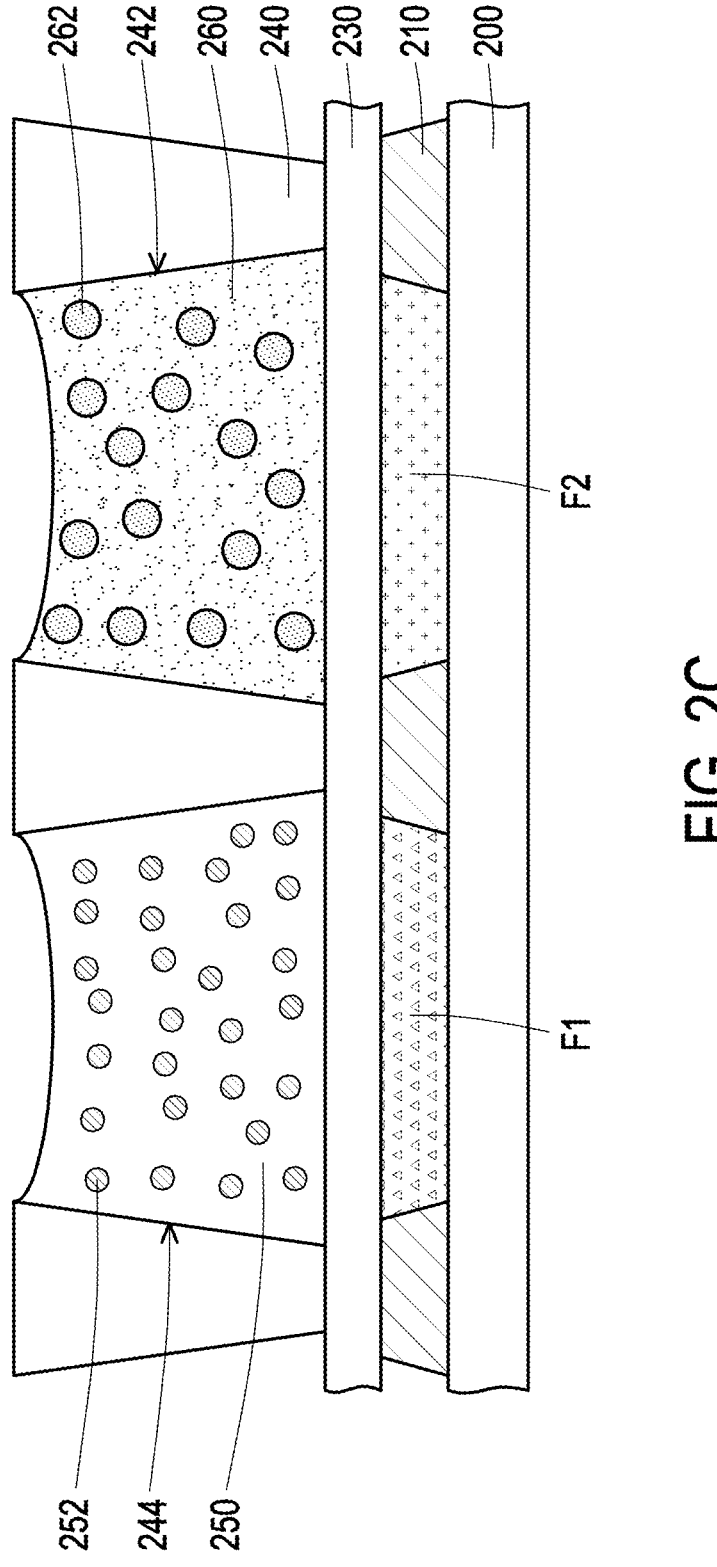

Referring to FIGS. 2B and 2C, the color conversion material layer 260 and the scattering material layer 250 are formed in the first opening 242 and the second opening 244 of the bank structure 240, respectively. The formation order of the color conversion material layer 260 and the scattering material layer 250 may be adjusted according to actual needs. The method of forming the color conversion material layer 260 and the scattering material layer 250 includes inkjet printing or other suitable processes.

Figure 2D:
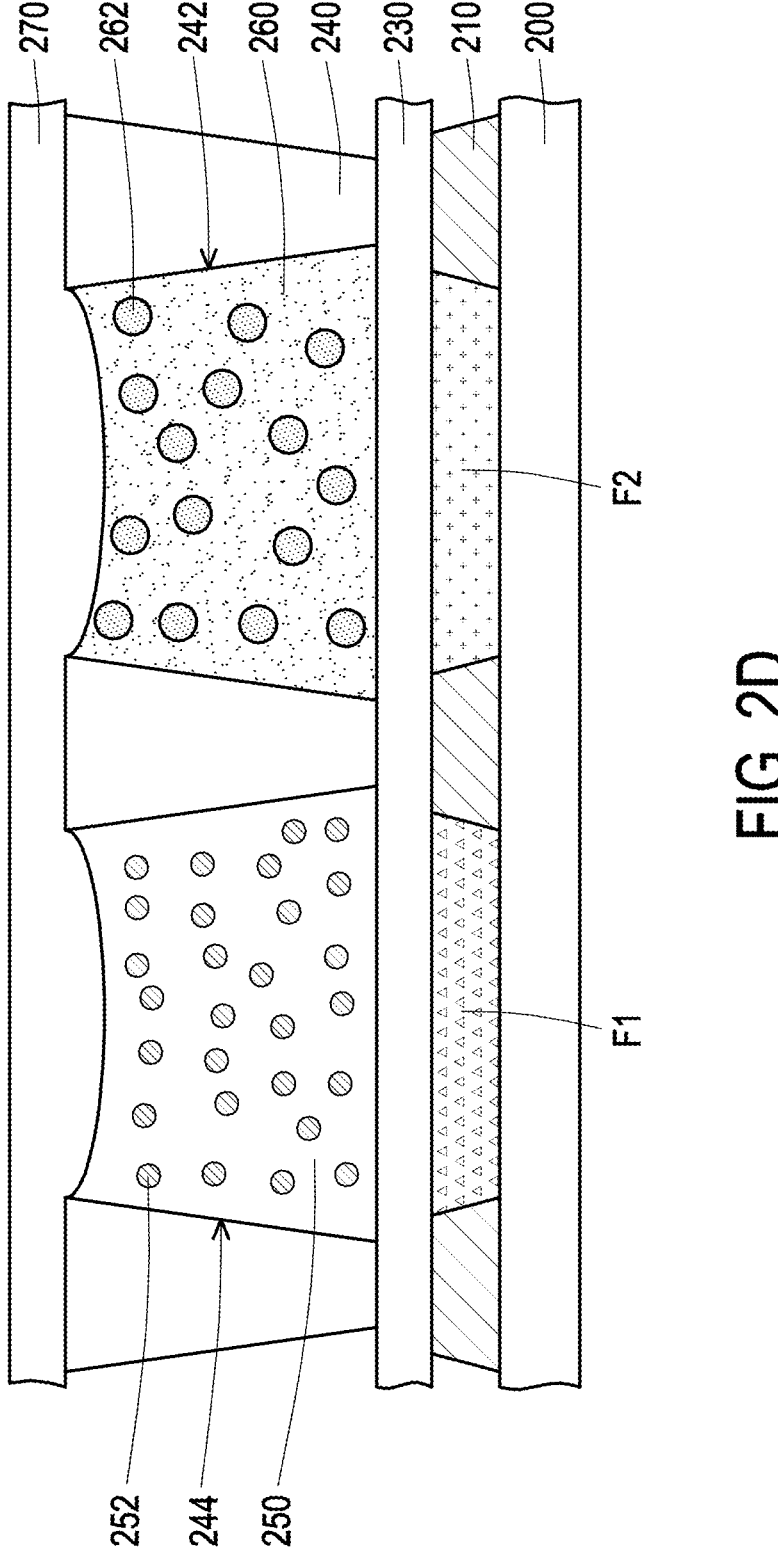

Referring to FIG. 2D, the second protection layer 270 is formed on the bank structure 240, the color conversion material layer 260 and the scattering material layer 250.

Figure 2E:
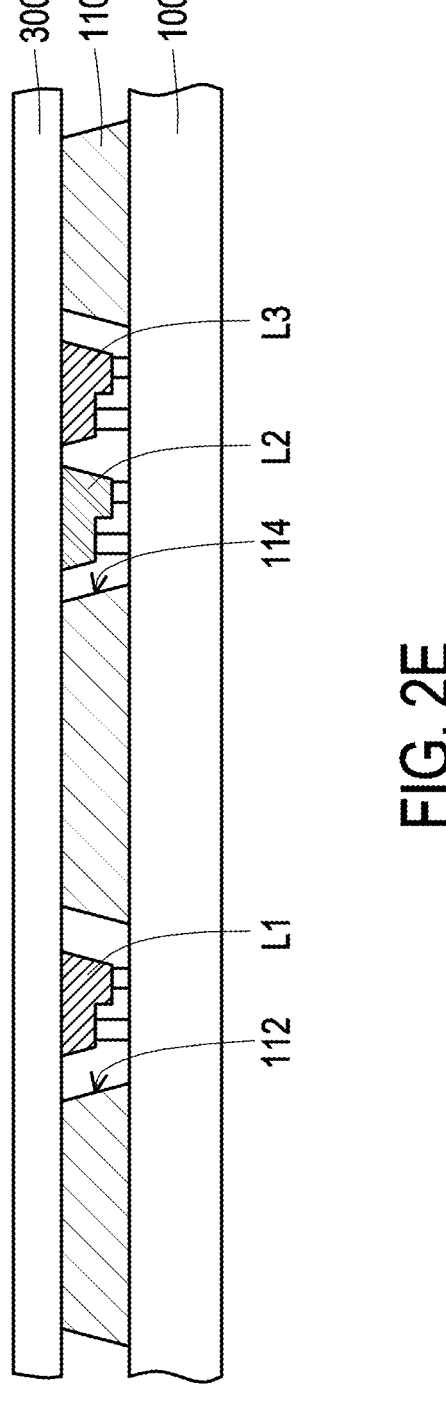

Referring to FIG. 2E, the first light-emitting diode L1, the second light-emitting diode L2 and the third light-emitting diode L3 are transferred from the grown substrate(s) (not shown) to the circuit board 100. The adhesive layer 300 is formed above the first light-emitting diode L1, the second light-emitting diode L2 and the third light-emitting diode L3.

Finally, the adhesive layer 300 is used to combine the structure of FIG. 2E and the structure of FIG. 2D to obtain the display device 10 shown in FIG. 1B.

Figure 4:
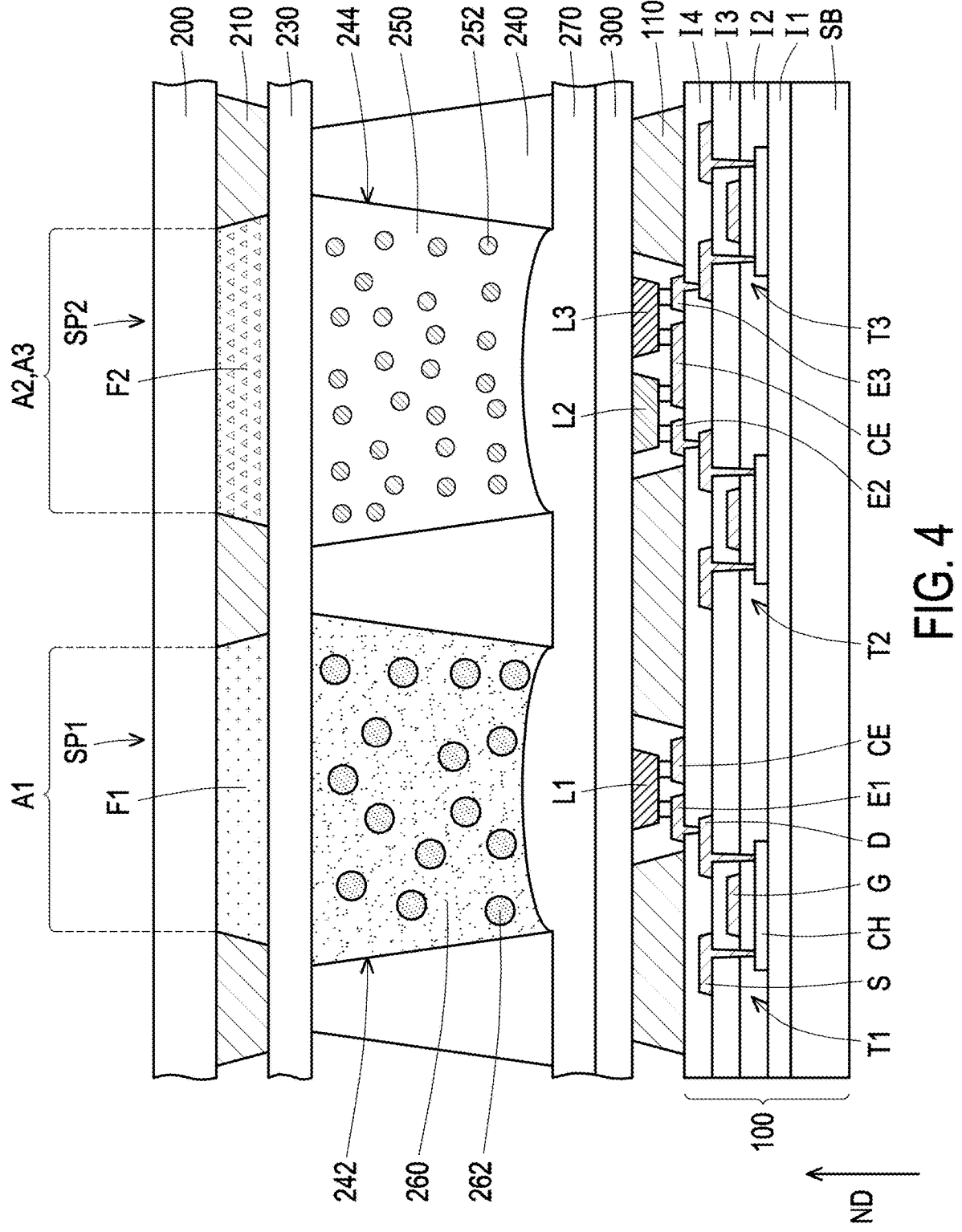
FIG. 4 is a schematic cross-sectional view of a display device according to an embodiment of the present invention.

FIG. 4 is a schematic cross-sectional view of a display device according to an embodiment of the present invention. It should be noted herein that, in embodiments provided in FIG. 4, element numerals and partial content of the embodiments provided in FIGS. 1A to 1D are followed, the same or similar reference numerals being used to represent the same or similar elements, and description of the same technical content being omitted. For a description of an omitted part, reference may be made to the foregoing embodiment, and the descriptions thereof are omitted herein.

Referring to FIG. 4, in this embodiment, the circuit board 100 includes a carrier SB and thin film transistors T1, T2, and T3 located on the carrier SB. The thin film transistors T1, T2, and T3 each include a channel CH, a gate electrode G, a source electrode S, and a drain electrode D. The first insulation layer I1 is located on carrier SB. The channel CH is located on the first insulation layer I1. The second insulation layer I2 is located on the channel CH. The gate electrode G is located on the second insulation layer I2 and overlapping with the channel CH. The third insulation layer I3 is located on the gate electrode G. The source electrode S and the drain electrode D are located on the third insulation layer I3 and electrically connected to the channel CH.

In this embodiment, the thin film transistors T1, T2, and T3 are top gate thin film transistors, but the invention is not limited thereto. In other embodiments, the thin film transistors T1, T2, and T3 are bottom gate film transistors, dual gate thin film transistors, or other types of thin film transistors.

The fourth insulation layer I4 is located on the thin film transistors T1, T2, and T3. Electrodes E1, E2, E3 and a common electrode CE are located on the fourth insulation layer I4. The electrodes E1, E2, and E3 electrically connect the thin film transistors T1, T2, and T3 to the first light-emitting diode L1, the second light-emitting diode L2, and the third light-emitting diode L3, respectively. The first light-emitting diode L1, the second light-emitting diode L2 and the third light-emitting diode L3 are electrically connected to the common electrode CE.

In some embodiments, the circuit board 100 may also include other active components and passive components.

In summary, by overlapping the second opening of the bank structure with the second and third light-emitting diodes, the widths of the first and second openings of the bank structure are increased. As a result, not only can the process difficulty of forming the color conversion material layer and scattering material layer be reduced, but the lateral distance between the light-emitting diodes and the bank structure can also be increased. Increasing the lateral distance between the light-emitting diodes and the bank structure may reduce the proportion of light emitted by the light-emitting diodes absorbed by the bank structure, thereby improving the luminous efficiency of the display device.

What is claimed is:
1. A display device, comprising:
   a circuit board;
   a first light-emitting diode, a second light-emitting diode and a third light-emitting diode, located above the circuit board, wherein the first light-emitting diode and the third light-emitting diode are light-emitting diodes of a same color, and the first light-emitting diode and the second light-emitting diode are light-emitting diodes of different colors;

a bank structure, located above the circuit board and having a first opening and a second opening, wherein the first opening is overlapping with the first light-emitting diode, and the second opening is overlapping with the second light-emitting diode and the third light-emitting diode, wherein the first light-emitting diode, the second light-emitting diode and the third light-emitting diode are respectively configured to cause the display device to generate a first light-emitting region, a second light-emitting region and a third light-emitting region, wherein the second light-emitting region is overlapping with the third light-emitting region;

a color conversion material layer, filled into the first opening;

a first color filter component, overlapping with the color conversion material layer; and a second color filter component, overlapping with the second opening.

2. The display device of claim 1, further comprises:

a black matrix, located between the first color filter component and the second color filter component, wherein the black matrix defines the first light-emitting region, the second light-emitting region and the third light-emitting region, and the second light-emitting region and the third light-emitting region are located at a same position.

3. The display device of claim 1, further comprises:

a light-shielding layer, located above the circuit board, wherein the light-shielding layer comprises a first hole and a second hole, wherein the first light-emitting diode is located in the first hole and is surrounded by the light-shielding layer, and the second light-emitting diode and the third light-emitting diode are located in the second hole and are surrounded by the light-shielding layer.

4. The display device of claim 1, wherein a first sub-pixel comprises the first light-emitting diode, a second sub-pixel comprises the second light-emitting diode and the third light-emitting diode, and the first sub-pixel and the second sub-pixel constitute a pixel.

5. The display device of claim 4, wherein the first sub-pixel further comprises a first placement region and a first repair region, and the second sub-pixel further comprises a second placement region, a second repair region, a third placement region and a third repair region, wherein the first light-emitting diode is disposed in the first placement region or the first repair region, the second light-emitting diode is disposed in the second placement region or the second repair region, and the third light-emitting diode is disposed in the third placement region or the third repair region.

6. The display device of claim 1, further comprises:

a first protection layer, located between the color conversion material layer and the first color filter component;

a second protection layer, located above the first light-emitting diode, the second light-emitting diode and the third light-emitting diode; and an adhesive layer, located between the first light-emitting diode and the second protection layer, between the second light-emitting diode and the second protection layer, and between the third light-emitting diode and the second protection layer.

7. The display device of claim 1, further comprises:

a scattering material layer, filled in the second opening, wherein the scattering material layer is overlapping with the second light-emitting diode and the third light-emitting diode.

8. The display device of claim 1, wherein the color conversion material layer comprises at least one of quantum dot materials, phosphorescent materials, fluorescent materials, dyes and perovskite materials.

9. The display device of claim 1, wherein the first light-emitting diode and the third light-emitting diode comprise blue light-emitting diodes, the second light-emitting diode comprises a green light-emitting diode, and the color conversion material layer comprises a color conversion material that emits red light after absorbing blue light, the first color filter component comprises a red color filter component, and the second color filter component comprises a blue-green color filter component.

10. The display device of claim 1, wherein the first light-emitting diode and the third light-emitting diode comprise blue light-emitting diodes, the second light-emitting diode comprises a red light-emitting diode, and the color conversion material layer comprises a color conversion material that emits green light after absorbing blue light, the first color filter component comprises a green color filter component, and the second color filter component comprises a purple color filter component.

* * * * *